(12) United States Patent
Rau

(10) Patent No.: US 6,707,123 B2  
(45) Date of Patent: Mar. 16, 2004

(54) EUV REFLECTION MASK

(75) Inventor: Jenspeter Rau, München (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/195,179

(22) Filed: Jul. 15, 2002

(65) Prior Publication Data

US 2003/0013216 A1 Jan. 16, 2003

(30) Foreign Application Priority Data

Jul. 13, 2001 (DE) .......................... 101 34 231

(51) Int. Cl.⁷ .......................... H01L 27/14; H01L 31/00
(52) U.S. Cl. .......................... 257/431; 257/911
(58) Field of Search .......................... 257/288, 290, 257/291, 294, 352, 428, 431, 436, 442, 444, 507, 659, 911, 921, 437

(56) References Cited

U.S. PATENT DOCUMENTS 6,015,640 A * 1/2000 Cardinale .................... 430/5
6,118,577 A * 9/2000 Sweatt et al. ............. 359/351
6,333,961 B1 * 12/2001 Murakami .................... 378/35

OTHER PUBLICATIONS

346696–6700, 1995, Japan, Murakani et al.*
49.849–853, 1998, Japan, Murakani et al.*
Tennant, D. M. et al.: "Mask Technologies for Soft–X–Ray Projection Lithography at 13 nm", Applied Optics, vol. 32, No. 34, Dec. 1, 1993, p. 7007.

* cited by examiner

Primary Examiner—David Nhu
(74) Attorney, Agent, or Firm—Laurence A. Greenberg; Werner H. Stemer; Ralph E. Locher

(57) ABSTRACT

In an EUV reflection mask which is set up for region-by-region exposure of a radiation-sensitive layer lying on a semiconductor wafer by means of radiation in the spectral region of extreme ultraviolet radiation, which radiation is reflected at the mask, patterns are written directly into a multilayer layer, lying on a substrate, by means of a focused laser beam or by ion implantation, the reflectivity of which patterns is reduced by more than 90% compared with the reflectivity of the regions that are not written to, and which patterns form the radiation-absorbing regions of the mask. This avoids the shadowing of the exposure radiation that is incident at a small angle, said shadowing occurring with the use of the EUV reflection masks that have been customary heretofore.

5 Claims, 2 Drawing Sheets

EUV REFLECTION MASK

BACKGROUND OF THE INVENTION

Field of the Invention

The invention lies in the semiconductor technology and lithography field and relates, more specifically, to an EUV reflection mask and a fabrication method therefor.

In EUV technology, a layer to be exposed which lies on a semiconductor wafer is exposed with EUV radiation, i.e. radiation in the extreme ultraviolet spectral range, by means of an EUV reflection mask. The exposure radiation thereby impinges on the mask not perpendicularly but at a small angle of incidence relative to the solder, is reflected from reflecting regions of the mask and then falls onto the light-sensitive layer of the wafer. This small angle of incidence is due to the fact that the exposure apparatuses that are customary nowadays do not provide central symmetrical guidance.

A fabrication method that has been customary heretofore for an EUV reflection mask and a mask thereby fabricated are explained below with reference to the FIGS. 3 and 4. FIG. 3 shows a mask blank 100 comprising a substrate 101, serving as a carrier support, an overlying multilayer layer 102 made of molybdenum and silicon layers, an optional top layer 103, which lies above the multilayer layer 102 and serves as oxidation protection a likewise optional buffer layer 104, an absorber layer 105, which has the property of absorbing the exposure radiation and is composed of chromium, for example, and a topmost resist layer 106. For mask fabrication, a desired exposure pattern is then written into the resist layer 106, the resist layer 106 is developed and the developed regions are etched to form pattern structures.

This method produces the EUV reflection mask 110 shown in FIG. 4. It is clear that the absorbing regions A form elevated structures above the multilayer layer 102 or the overlying top layer 103, and that the reflecting regions R lie recessed. The exposure radiation, i.e. EUV light, indicated by dashed arrows S must be directed, as mentioned, onto the mask surface at a small angle a. (The angle a is drawn in exaggerated fashion.) In this case, shadow casting arises at the edges of the projecting absorbing pattern regions A. Since this shadow casting is problematic for complying with precise exposure in particular of very small structures, it is desirable to avoid this shadow casting, or. reduce it to a minimum. At the present time, attempts are being made to reduce or eliminate the shadow casting by setting a specific angle of the walls of the absorbing structures A. A further attempt to fill the interspaces between the absorbing regions A with material of the multilayer layer 102 has not been successful heretofore.

This method produces the EUV reflection mask 110 shown in FIG. 4. It is clear that the absorbing regions A form elevated structures above the multilayer layer 102 or the overlying top layer 103, and that the reflecting regions R lie recessed. The exposure radiation, i.e. EVU light, indicated by dashed arrows S must be directed, as mentioned, onto the mask surface at a small angle a. (The angle a is drawn in exaggerated fashion.) In this case, shadow casting arises at the edges of the projecting absorbing pattern regions A. Since this shadow casting is problematic for complying with precise exposure in particular of very small structures, it is desirable to avoid this shadow casting, or reduce it to a minimum. At the present time, attempts are being made to reduce or eliminate the shadow casting by setting a specific angle of the walls of the absorbing structures A. A further attempt to fill the interspaces between the absorbing regions A with material of the multilayer layer 102 has not been successful heretofore.

SUMMARY OF THE INVENTION

It is an object of the invention, therefore, to specify a fabrication method for an EUV reflection mask and a reflection mask of this type that avoid the disadvantages of the prior art devices of the generic kind and which, specifically, avoid the problem of shadow casting. In this case, in an advantageous manner, lithography in the conventional sense will no longer be used in the mask fabrication, rather the mask will be produced in a single step.

With the foregoing and other objects in view there is provided, in accordance with the invention, a method of fabricating an EUV reflection mask for the region-by-region exposure of a radiation-sensitive layer on a semiconductor wafer, which comprises:

providing a substrate with a planar multilayer layer on a front side thereof;

carrying out a writing step to directly reduce a reflectivity of portions of the planar multilayer layer on the substrate to form radiation-absorbing mask regions and to form radiation-reflecting mask regions.

In accordance with an added feature of the invention, the multilayer layer comprises molybdenum and silicon layers.

In accordance with an additional feature of the invention, the writing step comprises irradiating with laser radiation to reduce the reflectivity of the radiation-absorbing mask regions. In the alternative, the writing step comprises reducing the reflectivity of the radiation-absorbing mask regions through ion implantation. Preferably, the ions are implanted into the radiation-absorbing mask regions by way of focused ion radiation.

A semiconductor can therefore be exposed by first forming a mask as outlined above and irradiating with radiation in a spectral range of extreme ultraviolet radiation to reflect with reflecting mask regions and to allow radiation to traverse the radiation-absorbing regions to expose the wafer in accordance with a pattern to be exposed on the semiconductor wafer.

With the above and other objects in view there is also provided, in accordance with the invention, an EUV reflection mask for region-by-region exposure of a radiation-sensitive layer on a semiconductor wafer with radiation in a spectral range of extreme ultraviolet radiation, comprising:

a multilayer layer with a planar surface on a front side of a substrate, said multilayer layer having sections with an altered material constitution or structure defining pattern regions configured to reflect EUV radiation and radiation-absorbing regions at a front side of the mask facing toward the semiconductor wafer to be exposed, said pattern regions and said radiation-absorbing regions corresponding to patterns to be formed on the semiconductor wafer;

wherein the material constitution or structure of the multilayer layer is altered in sections such that the radiation-absorbing pattern regions have a greatly reduced reflectivity compared with the radiation-reflecting regions.

In accordance with a concomitant feature of the invention, at least some layers of the multilayer layer are fused together at the regions of reduced reflectivity of the mask.

The inventors have recognized that it is possible to write the absorbing pattern structures directly into the multilayer layer 102. Through a suitable method, it is possible to reduce the reflectivity at the locations which are intended to absorb the exposure radiation, i.e. at the absorbing mask structures, either by layers of the multilayer layer 102 being fused together, or by impurity atoms being implanted into said absorbing regions by ion bombardment.

In an advantageous manner, the fabrication method according to the invention not only achieves a simplification of the process but also avoids the problem of shadowing, since the surface is planar and absorbing structures projecting from the surface of the mask no longer exist. The fabrication method according to the invention can achieve a difference in reflectivity between the radiation-reflecting regions and the radiation-absorbing regions in the multilayer layer of at least 90%.

Other features which are considered as characteristic for the invention are set forth in the appended claims.

Although the invention is illustrated and described herein as embodied in a EUV Reflection Mask, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
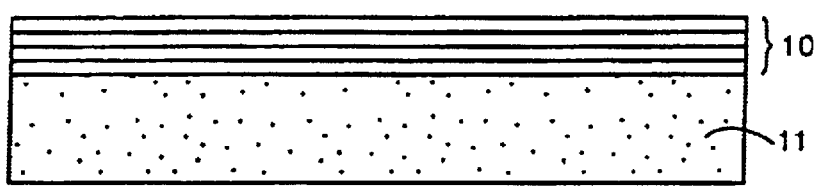
FIG. 1 is a diagrammatic cross sectional view taken through a mask blank which is made available as initial stage for a method according to the invention for fabricating an EUV reflection mask.

Referring now to the figures of the drawing in detail and first, specifically, to FIG. 1 thereof, the starting point for the method according to the invention for fabricating an EUV reflection mask which is used for a region-by-region exposure of a radiation-sensitive layer (e.g. resist layer) lying on a semiconductor wafer by means of radiation in the spectral range of extreme ultraviolet radiation (EUV), which radiation is reflected at the mask, is the blank which is shown in FIG. 1. The blank has a multilayer layer 10 made of molybdenum and silicon layers on a substrate 11 made, for example, of quartz, wafer semiconductor material or ceramic. The structures forming the radiation-absorbing regions are written directly into the multilayer layer 10 by means of a writing step, to be precise from the front side V. It has been recognized that a diffusion process begins in the multilayer layer 10, that is to say in the Mo layers and Si layers at a temperature >150° C., in the course of which diffusion process the individual molybdenum and silicon layers fuse together. Through this fusion, said Me molybdenum layers and silicon layers of the multilayer layer 10, as a result of the layer thicknesses, lose their capability for reflection in the previously selected spectral range.

Figure 2:
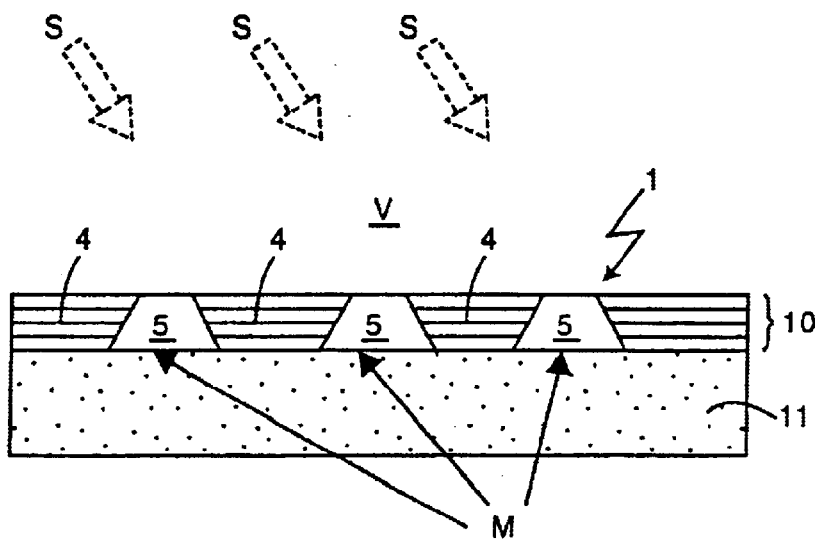
FIG. 2 is a diagrammatic cross sectional view taken through an EUV reflection mask according to the invention which is used to explain the fabrication steps according to the invention.
Figure 3:
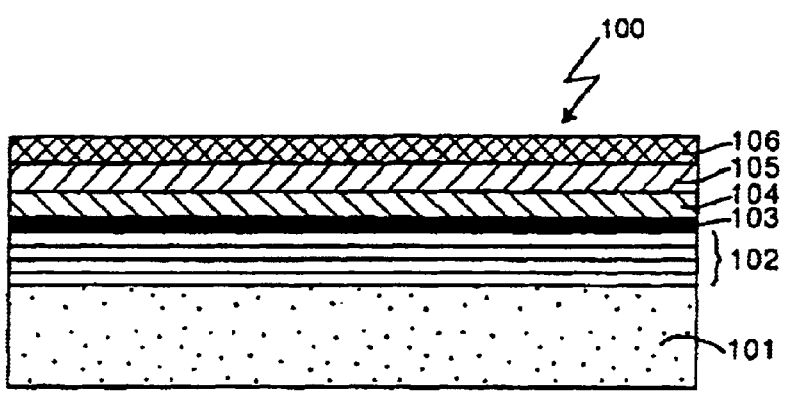
FIG. 3 shows a diagrammatic cross section through a mask blank, as described in the introductory text above, that is used to fabricate a known EUV reflection mask.
Figure 4:
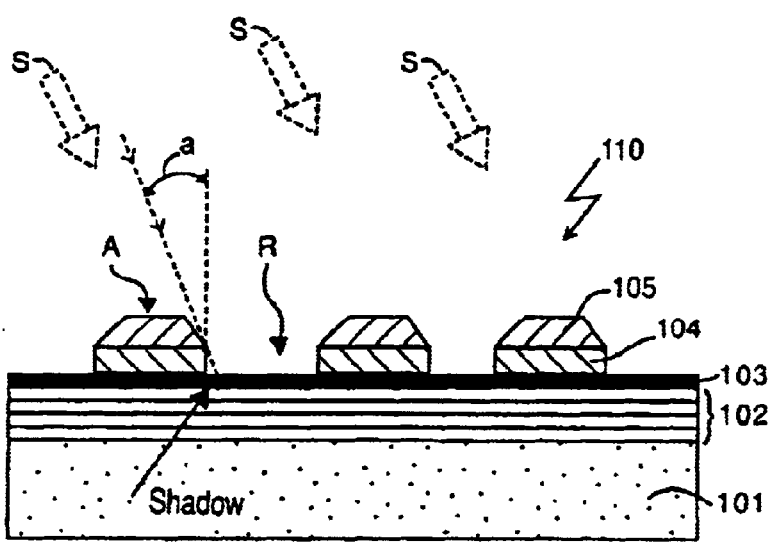
FIG. 4 diagrammatically shows a cross section through a prior art EUV reflection mask which is fabricated from the mask blank shown in FIG. 3.

The invention proposes two methods for performing the writing step:

First, there is provided laser induced reflection reduction: through laser radiation, energy can be deposited particularly in the form of heat in materials. This has been used for a long time for example during soldering with laser beams in material processing. It is known, moreover, that, by heating the reflection layers to temperatures around 200° C., the reflectivity is permanently reduced through diffusion of the atoms. This occurs as a result of shifting of the wavelength of the reflection maximum and reduction of the absolute reflectivity as a result of alteration of the difference in refractive index. In order to perform the writing step, the structure, i.e. the pattern of the radiation-absorbing regions 5, is written into the multilayer layer 10 by means of a highly focused laser beam (cw or pulsed). As a result, it is possible to achieve a difference in reflection between the written-to regions 5 and the non-written-to regions 4 of at least 90%. In FIG. 2, the arrows designated by M indicate the regions 5 where the molybdenum and silicon layers have fused together. The material need not be completely altered.

Second, there is provided ion implantation: focused ion beam apparatuses are used nowadays to apply or remove material. In EUV technology, the fact that the reflectivity is reduced by ion implantation into the multilayer layer has hitherto been regarded as one of the greatest problems. Precisely this effect is now utilized in the case of the fabrication method according to the invention. Using an ion implantation apparatus that is optimized for the implantations and speed, it is possible, for example, to implant gallium ions into the regions 5 which are intended to absorb light.

If, in the application of the EUV reflection mask in accordance with FIG. 2, exposure radiation S is incident at a small angle of 5°, for example, relative to the solder, no shadowing can arise at the light-absorbing regions 5 since their surface does not project from the surface of the multilayer layer 10. The exposure radiation S is reflected without shadowing at the reflecting regions 4 and projected back onto the wafer to be exposed (not shown).

I claim:

1. An EUV reflection mask for region-by-region exposure of a radiation-sensitive layer on a semiconductor wafer with radiation in a spectral range of extreme ultraviolet radiation, comprising:

a multilayer layer with a planar surface on a front side of a substrate, said multilayer layer having sections with an altered material constitution or structure defining pattern regions configured to reflect EUV radiation and radiation-absorbing regions at a front side of the mask facing toward the semiconductor wafer to be exposed, said pattern regions and said radiation-absorbing regions corresponding to patterns to be formed on the semiconductor wafer;

wherein the material constitution or structure of the multilayer layer is altered in sections such that the radiation-absorbing pattern regions have a greatly reduced reflectivity compared with the radiation-reflecting regions while maintaining a planar surface of said multilayer layer.

2. The EUV reflection mask according to claim 1, wherein said multilayer layer comprises molybdenum and silicon layers.

3. The EUV reflection mask according to claim 1, wherein at least some layers of the multilayer layer are fused together at the regions of reduced reflectivity of the mask.

4. The EUV reflection mask according to claim 1, wherein impurity ions are implanted into at least some layers of the multilayer layer at the regions of reduced reflectivity.

5. The EUV reflection mask according to claim 1, wherein a difference in reflectivity between the radiation-reflecting pattern regions and the radiation-absorbing pattern regions in the multilayer layer is at least 90%.

* * * * *